(12) United States Patent
Yu et al.

(10) Patent No.: US 11,092,836 B2
(45) Date of Patent: Aug. 17, 2021

(54) ARRAY SUBSTRATE, MANUFACTURING METHOD FOR THE SAME AND IN-CELL TOUCH PANEL

(71) Applicant: Wuhan China Star Optoelectronics Technology Co., Ltd., Hubei (CN)

(72) Inventors: Pengfei Yu, Hubei (CN); Jiawei Zhang, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 524 days.

(21) Appl. No.: 16/068,876

(22) PCT Filed: Apr. 24, 2018

(86) PCT No.: PCT/CN2018/084149
§ 371 (c)(1),
(2) Date: Jul. 9, 2018

(87) PCT Pub. No.: WO2019/184033
PCT Pub. Date: Oct. 3, 2019

(65) Prior Publication Data
US 2020/0355954 A1    Nov. 12, 2020

(30) Foreign Application Priority Data

Mar. 30, 2018 (CN) .......................... 201810275960.7

(51) Int. Cl.
*G02F 1/1333* (2006.01)
*G06F 3/041* (2006.01)
*H01L 27/12* (2006.01)

(52) U.S. Cl.
CPC ........ *G02F 1/13338* (2013.01); *G06F 3/0412* (2013.01); *H01L 27/124* (2013.01);
(Continued)

(58) Field of Classification Search
CPC ... G02F 1/13338; G06F 3/0412; H01L 27/124
See application file for complete search history.

(56) References Cited

U.S. PATENT DOCUMENTS

| 2010/0188361 | A1  | 7/2010 | Kim et al. |
| 2011/0228188 | A1* | 9/2011 | Kim ................... G02F 1/13338 349/43 |

(Continued)

FOREIGN PATENT DOCUMENTS

| CN | 104503172 | 4/2015 |
| CN | 105116648 | 12/2015 |

(Continued)

*Primary Examiner* — Cuong Q Nguyen
*Assistant Examiner* — Peter M Albrecht
(74) *Attorney, Agent, or Firm* — Leong C. Lei

(57) ABSTRACT

The present invention discloses an array substrate, including: a first metal layer, a second metal layer and a common electrode layer which are insulated from each other and sequentially formed on a base substrate; the first metal layer includes a gate line, the second metal layer includes a data line, and the common electrode layer includes a touch sensing electrode; the second metal layer includes a touch signal line, the touch signal line is electrically connected to the touch sensing electrode, and the touch signal line and the data line are intersected each other and are disconnected at an intersection location; and the first metal layer includes a bridging connection line, two ends of the bridging connection line are connected to the touch signal line such that the touch signal line disconnected at the intersection location are electrically connected. A manufacturing method and an in-cell touch panel are also disclosed.

6 Claims, 3 Drawing Sheets

(52) U.S. Cl.
CPC .... *H01L 27/1259* (2013.01); *G02F 2201/121* (2013.01); *G02F 2201/123* (2013.01); *G06F 2203/04103* (2013.01)

(56) References Cited

U.S. PATENT DOCUMENTS

2016/0071891 A1\* 3/2016 Oh .................... H01L 29/66757
 257/72
2016/0246427 A1\* 8/2016 Ming ................ G02F 1/136286

FOREIGN PATENT DOCUMENTS

| CN | 206400518 | 8/2017 |
| EP | 2 211 227 A1 | 7/2010 |

\* cited by examiner

ARRAY SUBSTRATE, MANUFACTURING METHOD FOR THE SAME AND IN-CELL TOUCH PANEL

RELATED APPLICATIONS

The present application is a National Phase of International Application Number PCT/CN2018/084149, filed Apr. 24, 2018, and claims the priority of China Application No. 201810275960.7, filed Mar. 30, 2018.

FIELD OF THE INVENTION

The present invention relates to a display technology field, and more particularly to an array substrate and a manufacturing method for the same, and in-cell touch panel and a liquid crystal display device including the array substrate.

BACKGROUND OF THE INVENTION

With the development of the information age and the acceleration of the pace of life, a touch-control technology has gradually replaced traditional mice and keyboards due to its humanized design and simple and quick input interface. The touch-control technology has been widely applied to a wide variety of electronic products. Wherein, a capacitive touch screen has been widely used because of their advantages such as fast response, high sensitivity, good reliability, and high durability.

According to the arrangement of the touch sensing layer, the touch screen can be divided into an external mounted (Add on Mode), an In-cell, and an On-cell structure. Wherein, the In-cell touch screen integrates the touch function into the display screen, which can effectively reduce the thickness of the entire display, making the product thinner and lighter.

For the in-cell touch panel, the touch sensing electrodes and the touch signal lines in the touch panel structure are usually directly disposed on an array substrate or a filter substrate. FIG. 1 is a schematic structural diagram of an array substrate having a touch screen structure in the conventional art. As shown in FIG. 1, the array substrate includes: a base substrate 1, a thin film transistor 2 disposed on the base substrate 1, a planarization layer 3 disposed on the thin film transistor 2, and a touch signal line 4 disposed on the planarization layer 3, a first insulation layer 5 disposed on the touch signal line 4, a touch sensing electrode 6 disposed on the first insulation layer 5, a second insulation layer 7 disposed on the touch sensing electrode 6, and a pixel electrode 8 disposed on the second insulating layer 7. The touch signal line 4 is connected to the touch sensing electrode 6 through a via hole disposed in the first insulation layer 5 for connecting the touch sensing electrode 6 to an external touch driving chip. The pixel electrode 8 is electrically connected to the thin film transistor 2 through the via hole provided in the first insulation layer 7, the second insulation layer 5, and the planarization layer 3.

The array substrate is completed by forming a structural pattern through a plurality of mask processes (patterning processes), and each of the mask processes includes a process of coating, exposing, developing, etching and stripping. Wherein the etching process includes dry etching and wet etching. The number of the mask processes can be used to measure the degree of complication of manufacturing a thin film transistor array substrate, and reducing the number of mask processes means a reduction in manufacturing costs. For the array substrate with a touch screen structure as shown in FIG. 1, since the touch signal line 4, the touch sensing electrode 6 and the first insulation layer 5 between them are added on the array substrate, the number of the mask processes during the manufacturing process is increased correspondingly. Therefore, how to reduce the number of mask processes of an array substrate having a touch screen structure is an issue that the industry has been exploring to solve.

SUMMARY OF THE INVENTION

Accordingly, the present invention provides an array substrate. Wherein, a touch screen structure is embedded, and through improving the layout of the touch sensing electrodes and the touch signal lines in the touch screen structure, the number of the mask processes in the manufacturing process of the array substrate is reduced in order to reduce costs.

In order to achieve the above purpose, the present invention adopts the following technology solution:

an array substrate, comprising: a first metal layer, a second metal layer and a common electrode layer which are insulated from each other and sequentially formed on a base substrate; wherein the first metal layer includes a gate line, the second metal layer includes a data line, and the common electrode layer includes a touch sensing electrode; wherein the second metal layer includes a touch signal line, the touch signal line is electrically connected to the touch sensing electrode, and the touch signal line and the data line are intersected each other and are disconnected at an intersection location; and wherein the first metal layer includes a bridging connection line, two ends of the bridging connection line are connected to the touch signal line such that the touch signal line disconnected at the intersection location are electrically connected.

Wherein the array substrate is provided with a thin film transistor including a semiconductor active layer, a gate electrode, a source electrode, and a drain electrode; wherein; the semiconductor active layer is formed on the base substrate, a gate insulation layer is covered on the semiconductor active layer, the first metal layer is formed on the gate insulation layer, the gate electrode is formed in the first metal layer, the first metal layer is covered with the interlayer dielectric layer, the second metal layer is formed on the interlayer dielectric layer, the source electrode and the drain electrode are formed in the second metal layer, the second metal layer is covered with a planarization layer, and the common electrode layer is formed on planarization layer; wherein the bridging connection line is connected to the touch signal line through a first via hole disposed in the interlayer dielectric layer, the touch sensing electrode is connected to the touch signal line through a second via hole disposed in the planarization layer, the source electrode and the drain electrode are connected to the semiconductor active layer through a third via hole disposed in the interlayer dielectric layer and the gate insulation layer.

Wherein a passivation layer and a pixel electrode layer are sequentially disposed on the common electrode layer, the pixel electrode layer is connected to the drain electrode through a fourth via hole provided in the passivation layer and the planarization layer.

Wherein a material of the semiconductor active layer is low-temperature polysilicon.

Wherein a buffering layer is disposed between the semiconductor active layer and the base substrate.

The present invention also provides a manufacturing method for the above array substrate; and the method comprises steps of: S101: providing a base substrate, depositing a semiconductor thin film layer on the base substrate, and patterning the semiconductor film layer to form a semiconductor active layer; S102: depositing a gate insulation layer on the base substrate, and the gate insulation layer covers the semiconductor active layer; S103: depositing a first metal layer on the gate insulation layer, and patterning the first metal layer to form a gate electrode, a gate line, and a bridging connection line; S104: depositing an interlayer dielectric layer on the first metal layer, and patterning the interlayer dielectric layer and the gate insulation layer to form a first via hole that reveals both ends of the bridging connection line, and a third via hole that reveals both ends of the semiconductor active layer; S105, depositing a second metal layer on the interlayer dielectric layer, patterning the second metal layer in order to form a source electrode, a drain electrode, a data line, and a touch signal line, the touch signal line and the data line are intersected each other and are disconnected at an intersection location, the source electrode and the drain electrode are respectively connected to two ends of the semiconductor active layer through the third via hole, and the touch signal lines at two sides of the intersection location is connected to both ends of the bridging connection line through the first through hole; S106, depositing a planarization layer on the second metal layer, and patterning the planarization layer to form a second via hole that reveals the touch signal line; and S107, depositing a common electrode layer on the planarization layer, and patterning the common electrode layer to form a touch sensing electrode, the touch sensing electrode is connected to the touch signal line through the second via hole.

Wherein the method further comprises steps of: S108: depositing a passivation layer on the common electrode layer, and patterning the passivation layer and the planarization layer to form a fourth via hole that reveals the drain electrode; and S100: depositing a pixel electrode film layer on the passivation layer, and patterning the pixel electrode film layer to form a pixel electrode layer, the pixel electrode layer is connected to the drain electrode through a fourth via hole.

Wherein a material of the semiconductor active layer is low-temperature polysilicon.

Wherein in the step 101, depositing a buffering layer on the base substrate, and depositing an amorphous silicon layer on the buffering layer.

The present invention further provides an in-cell touch panel, comprising: an array substrate and a color filter substrate disposed oppositely; a liquid crystal layer disposed between the array substrate and the color filter substrate; wherein the array substrate is an array substrate illustrated above.

Compared with the prior art, the array substrate provided in the embodiment of the present invention disposes the touch signal line in the touch screen structure in the same structural layer as the data line, and does not require disposing a metal for forming the touch signal line. At the same time, a corresponding interlayer insulation layer due to the increase of the metal layer is also saved, and the material cost is reduced. Furthermore, since both the touch signal lines and the data lines are located in the second metal layer, both can be prepared in the same mask process, thereby reducing the number of mask processes in the process of manufacturing the array substrate, and further reduce the costs.

DETAILED DESCRIPTION OF PREFERRED EMBODIMENTS

Figure 1:
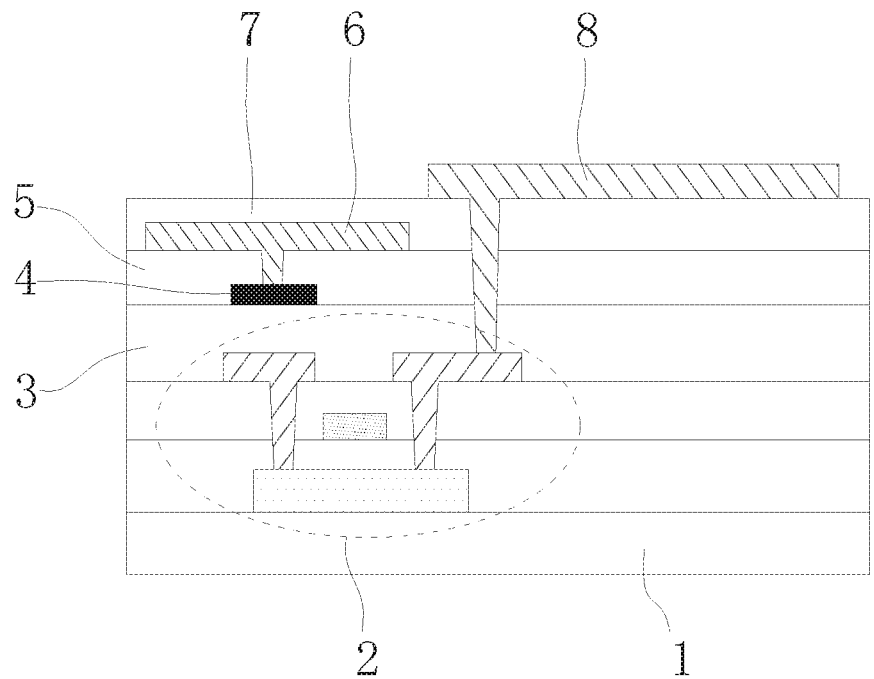
FIG. 1 is a schematic structural diagram of an array substrate having a touch screen structure in the conventional art.

To make the objectives, technical solutions, and advantages of the present invention clearer, the following describes the specific implementation manners of the present invention in detail with reference to the accompanying drawings. Examples of these preferred embodiments are illustrated in the accompanying drawings. The embodiments of the present invention shown in the drawings and described with reference to the drawings are merely exemplary, and the present invention is not limited to these embodiments.

Here, it should also be noted that, in order to avoid obscuring the present invention due to unnecessary details, only the structures and/or processing steps closely related to the solution according to the present invention are shown in the drawings, and are omitted. The other details of the invention are not significant.

Figure 2:
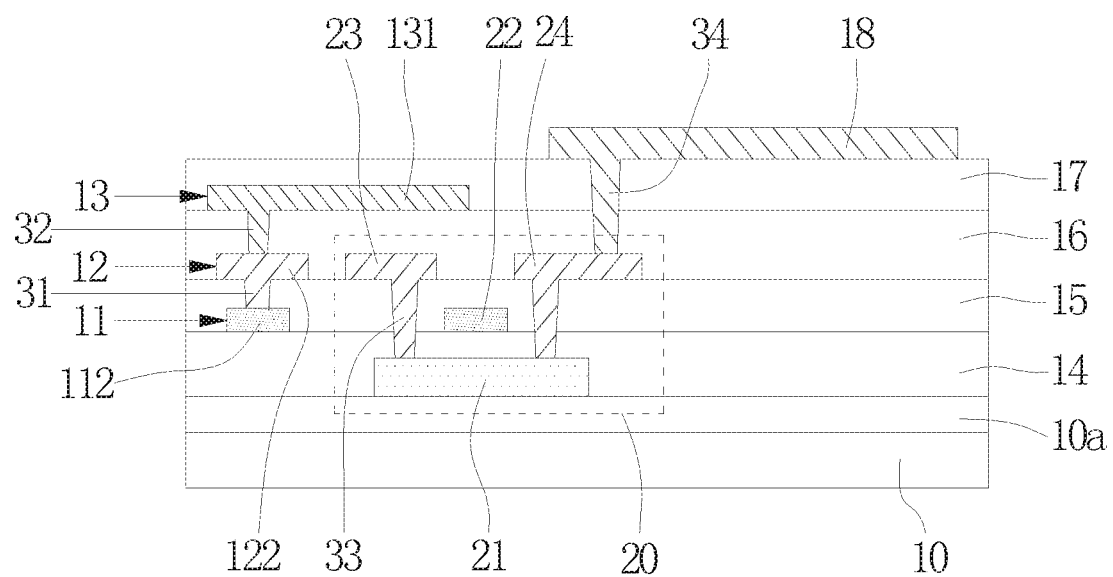
FIG. 2 is a schematic structural diagram of an array substrate according to an embodiment of the present invention.
Figure 3:
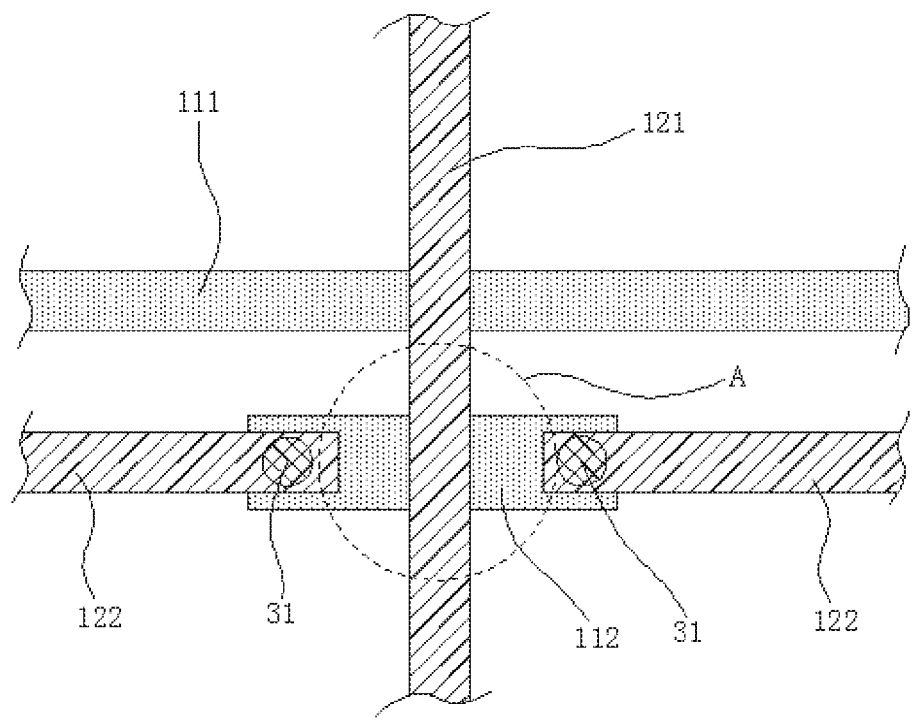
FIG. 3 is an exemplary diagram illustrating that a touch signal line and a bridging connection are connected to each other according to an embodiment of the present invention.

This embodiment firstly provides an array substrate. With reference to FIG. 2 and FIG. 3, the array substrate includes a first metal layer 11, a second metal layer 12 and a common electrode layer 13 which are insulated from each other and sequentially formed on a base substrate 10. Wherein, the first metal layer 11 is provided with a gate line 111, the second metal layer 12 is provided with a data line 121, and a touch sensing electrode 131 is formed in the common electrode layer 13. An interlayer dielectric layer 15 is disposed between the first metal layer 11 and the second metal layer 12 to insulate the first metal layer 11 from the second metal layer 12. The interlayer dielectric layer 15 is provided between the second metal layer 12 and the common electrode layer 13 to insulate the second metal layer 12 from the common electrode layer 13.

Wherein, the touch sensing electrodes 131 in the common electrode layer 13 are can also function as a common electrode. During the display time of a frame, the touch sensing electrodes 131 are used to deliver a common voltage and a touch signal in a time-division manner. In this embodiment, as shown in FIG. 2 and FIG. 3, a touch signal line 122 is further formed in the second metal layer 12. The touch signal line 122 is electrically connected to the touch sensing electrode 131. The touch signal line 122 and the data line 121 are intersected each other and are disconnected at an intersection location A. A bridging connection line 112 is also formed in the first metal layer 11, and two ends of the bridging connection line 112 are connected to the touch signal line 122 such that the touch signal line 122 disconnected at the intersection location A are electrically connected. The bridging connection line 112 electrically connect the touch signal lines 122 disconnected in the second metal layer 12 to each other through bridging so as to connect the touch sensing electrode 131 to an external driving chip.

Specifically, as shown in FIG. 2, a thin film transistor 20 is disposed in the array substrate, and the thin film transistor 20 includes a semiconductor active layer 21, a gate electrode 22, a source electrode 23, and a drain electrode 24, Wherein, the base substrate 10 is firstly provided with a buffering layer 10 a, the semiconductor active layer 21 is formed on the base substrate 10, and a gate insulation layer 14 is covered on the semiconductor active layer 21. The first metal layer 11 is formed on the gate insulation layer 14, the gate electrode 22 is formed in the first metal layer 11. The first metal layer 11 is covered with the interlayer dielectric layer 15. The second metal layer 12 is formed on the interlayer dielectric layer 15, the source electrode 23 and the drain electrode 24 are formed in the second metal layer 12, and the second metal layer 12 is covered with a planarization layer 16. The common electrode layer 13 is formed on planarization layer 16.

Furthermore, the array substrate further includes a pixel electrode layer 18. Specifically, the common electrode layer 13 is covered with a passivation layer 17, the pixel electrode layer 18 is disposed on the passivation layer 17, and the pixel electrode layer 18 is electrically connected to the thin film transistor 20.

Specifically, as shown in FIG. 2, the bridging connection line 112 is connected to the touch signal line 122 through a first via hole 31 disposed in the interlayer dielectric layer 15. The touch sensing electrode 131 is connected to the touch signal line 122 through a second via hole 32 disposed in the planarization layer 16. The source electrode 23 and the drain electrode 24 are connected to the semiconductor active layer 21 through a third via hole 33 disposed in the interlayer dielectric layer 15 and the gate insulation layer 14. Wherein the source electrode 23 is connected to one end of the semiconductor active layer 21 through one of the third via holes 33, and the drain electrode 24 is connected to the other end of the semiconductor active layer 21 through another one of the third via holes 33. The pixel electrode layer 18 is connected to the drain electrode 24 through a fourth via hole 34 provided in the passivation layer 17 and the planarization layer 16.

With reference to FIG. 2 and FIG. 3, in this embodiment, the touch signal line 122 and the data line 121 are intersected vertically with each other, and the bridging connection lines 112 and the gate lines 111 are arranged parallel to each other. It should be noted that the touch signal line 122, the data line 121, the source electrode 23, and the drain electrode 24 are all located in the second metal layer 12, and are formed through a patterning process using a same mask to the second metal layer 12. The data line 121 and the source electrode 23 are connected to each other. The bridging connection line 112, the gate line 111, and the gate electrode 22 are all located in the first metal layer 11, and are formed by a patterning process using a same mask process to the first metal layer 11. The gate line 111 and the gate electrode 22 are connected to each other.

This embodiment also provides a method for manufacturing an array substrate as described above. The manufacturing process of the array substrate will be described below with reference to FIG. 2 and FIG. 3, The manufacturing process includes following steps:

In a step S101, providing a base substrate 10, depositing a semiconductor thin film layer on the base substrate 10, and patterning the semiconductor film layer to form a semiconductor active layer 21. In this embodiment, the material of the semiconductor thin film layer is low-temperature polysilicon. The step S101 specifically includes: firstly, depositing a buffering layer 10a on the base substrate 10, then depositing an amorphous silicon layer on the buffering layer 10a, and then applying an excimer laser annealing process to crystallize the amorphous silicon layer crystal in order to form a low-temperature polysilicon layer, and finally, patterning the low-temperature polysilicon layer to form the semiconductor active layer 21. Wherein, the base substrate 10 is selected to use a glass substrate. The material of the buffering layer 10a may be selected as SiNx, SiOx, or a combination thereof.

S102, depositing a gate insulation layer 14 on the base substrate 10. The gate insulation layer 14 covers the semiconductor active layer 21. Wherein, the material of the gate insulation layer 14 may be selected as SiNx, SiOx or a combination thereof.

S103, depositing a first metal layer 11 on the gate insulation layer 14, and patterning the first metal layer 11 to form a gate electrode 22, a gate line 111, and a bridging connection line 112. In this embodiment, the material of the first metal layer 11 is molybdenum (Mo).

S104: depositing an interlayer dielectric layer 15 on the first metal layer 11, and patterning the interlayer dielectric layer 15 and the gate insulation layer 14 to form a first via hole 31 that reveals both ends of the bridging connection line 112, and a third via hole 33 that reveals both ends of the semiconductor active layer 21. Wherein, the material of the interlayer dielectric layer 15 may be selected as SiNx, SiOx, or a combination thereof.

S105, depositing a second metal layer 12 on the interlayer dielectric layer 15, patterning the second metal layer 12 in order to form a source electrode 23, a drain electrode 24, a data line 121, and a touch signal line 122, The touch signal line 122 and the data line 121 are intersected each other and are disconnected at an intersection location A. The source electrode 23 and the drain electrode 24 are respectively connected to two ends of the semiconductor active layer 21 through the third via hole 33, and the touch signal lines 12 at two sides of the intersection location is connected to both ends of the bridging connection line 112 through the first through hole 31. Through the connection of the bridging connection line 112, the touch signal lines 122 disconnected in the second metal layer 12 are electrically connected to each other. In this embodiment, the material of the second metal layer 12 is molybdenum (Mo).

S106, depositing a planarization layer 16 on the second metal layer 12, and patterning the planarization layer 16 to form a second via hole 32 that reveals the touch signal line 122. Wherein, the material of the planarization layer 16 may be selected as SiNx, SiOx or a combination of SiNx and SiOx.

S107, depositing a common electrode layer 13 on the planarization layer 16, and patterning the common electrode layer 13 to form a touch sensing electrode 131. The touch sensing electrode 131 is connected to the touch signal line 122 through the second via hole 32. In this embodiment, the material of the common electrode layer 13 is ITO.

S108: depositing a passivation layer 17 on the common electrode layer 13, and patterning the passivation layer 17 and the planarization layer 16 to form a fourth via hole 34 that reveals the drain electrode 24. Wherein, the material of the passivation layer 17 may be selected as SiNx, SiOx, or a combination thereof.

S109, depositing a pixel electrode film layer on the passivation layer 17, and patterning the pixel electrode film layer to form a pixel electrode layer 18. The pixel electrode layer 18 is connected to the drain electrode 24 through a fourth via hole 34. In this embodiment, the material of the pixel electrode layer 18 is ITO.

As described above, the array substrate and the method for manufacturing the same, the touch signal line 122 in the touch screen structure is disposed in the same structural layer as the data line 121. Comparing with the prior art (as shown in the schematic structure of FIG. 1). The metal layer for forming the touch signal line 122 is not required, and at the same time, a corresponding interlayer insulation layer (such as the insulation layer 5 in FIG. 1) due to the metal layer is also saved, and the material cost is reduced. Furthermore, since both the touch signal lines 122 and the data lines 121 are located in the second metal layer, both can be formed in the same mask process, thereby reducing the number of mask processes in the process of fabricating the array substrate, and reducing costs.

Figure 4:
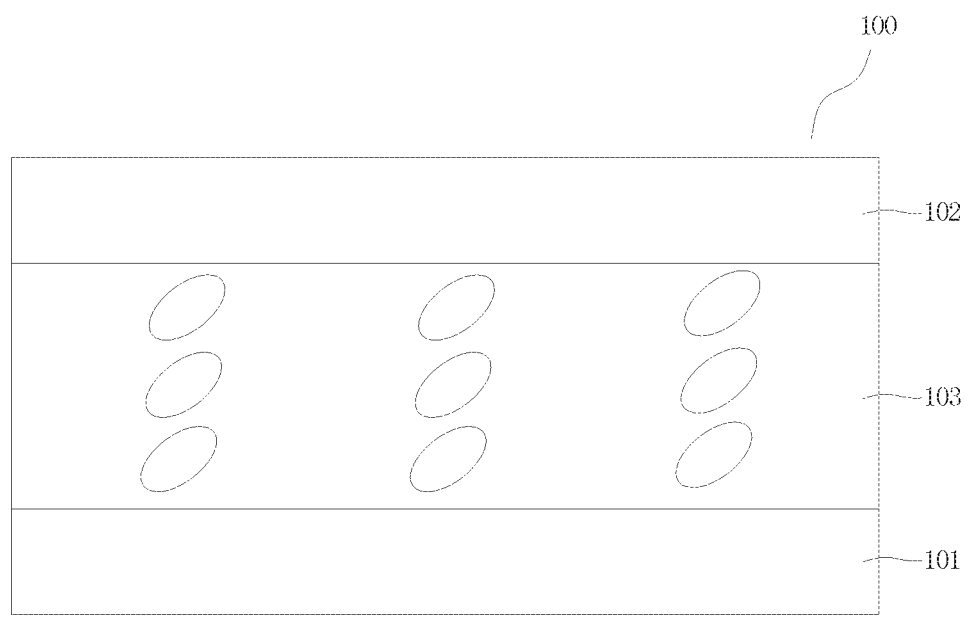
FIG. 4 is a schematic structural diagram of an in-cell touch panel provided by an embodiment of the present invention.

An embodiment of the present invention further provides an in-cell touch panel. As shown in FIG. 4, the in-cell touch panel 100 includes an array substrate 101 and a filter substrate 102 disposed oppositely. Between the array substrate 101 and the filter substrate 102, a liquid crystal layer 103 is provided. Wherein, the array substrate 101 adopts the array substrate as described above in this embodiment.

Figure 5:
FIG. 5 is a schematic structural diagram of a liquid crystal display device according to an embodiment of the present invention.

Furthermore, this embodiment further provides a liquid crystal display device. As shown in FIG. 5, the liquid crystal display device includes a backlight module 200 and an in-cell touch panel 100 as described above. The backlight module 200 is disposed on the back of the in-cell touch panel 100. The backlight module 200 may select a direct type backlight module or a side-light type backlight module. The backlight module 200 provides a display light to the in-cell touch screen 100 so that the in-cell touch screen 100 displays images.

In summary, the array substrate and corresponding in-cell touch panel and liquid crystal display device provided in the embodiments of the present invention improve the layout of the touch sensing electrodes and the touch signal lines in the touch screen structure, thereby reducing the production cost.

It should be noted that, herein, relational terms such as first and second, and the like are only used to distinguish one entity or operation from another entity or operation. It is not required or implied that these entities or operations exist any such relationship or order between them. Moreover, the terms "comprise," include," or any other variation thereof, are intended to cover a non-exclusive inclusion, such that a series of elements including the process, method, article or device that includes not only those elements but also other elements not expressly listed or further comprising such process, method, article or device inherent elements. Without more constraints, by the statement "comprises one . . . " element defined does not exclude the existence of additional identical elements in the process, method, article, or apparatus.

The above embodiments of the present invention are only exemplary, however, the present invention is not limited. The person skilled in the art can understand: without exceeding the principle and spirit of the present invention, the above embodiments can be improved, wherein, the scope of the present invention is limited in the claims and the equivalents of the claims.

What is claimed is:

1. An array substrate, comprising:
a first metal layer, a second metal layer and a common electrode layer which are insulated from each other and sequentially formed on a base substrate;
wherein the first metal layer includes a gate line, the second metal layer includes a data line, and the common electrode layer includes a touch sensing electrode;
wherein the second metal layer includes a touch signal line, the touch signal line is electrically connected to the touch sensing electrode, and the touch signal line and the data line are intersected with each other and are disconnected from each other at an intersection location;
wherein the first metal layer includes a bridging connection line, two ends of the bridging connection line are respectively connected to two portions of the touch signal line such that the two portions of the touch signal line that are physically disconnected at the intersection location are electrically connected; and
wherein the touch signal line and the bridging connection line are respectively included in the second metal layer that includes the data line and the first metal layer that includes the gate line, such that the touch signal line and the data line are arranged in the same layer and the bridging connection line and the gate line are also arranged in the same layer.

2. The array substrate according to claim 1, wherein the array substrate is provided with a thin film transistor including a semiconductor active layer, a gate electrode, a source electrode, and a drain electrode;
wherein the semiconductor active layer is formed on the base substrate, a gate insulation layer is covered on the semiconductor active layer, the first metal layer is formed on the gate insulation layer, the gate electrode is formed in the first metal layer, the first metal layer is covered with an interlayer dielectric layer, the second metal layer is formed on the interlayer dielectric layer, the source electrode and the drain electrode are formed in the second metal layer, the second metal layer is covered with a planarization layer, and the common electrode layer is formed on the planarization layer;
wherein the bridging connection line is connected to the touch signal line through a first via hole disposed in the interlayer dielectric layer, the touch sensing electrode is connected to the touch signal line through a second via hole disposed in the planarization layer, the source electrode and the drain electrode are connected to the semiconductor active layer through a third via hole disposed in the interlayer dielectric layer and the gate insulation layer.

3. The array substrate according to claim 2, wherein a passivation layer and a pixel electrode layer are sequentially disposed on the common electrode layer, the pixel electrode layer is connected to the drain electrode through a fourth via hole provided in the passivation layer and the planarization layer.

4. The array substrate according to claim 2, wherein a material of the semiconductor active layer is low-temperature polysilicon.

5. The array substrate according to claim 4, wherein a buffering layer is disposed between the semiconductor active layer and the base substrate.

6. The array substrate according to claim 5, wherein a material of the buffering layer is SiNx, SiOx or a combination thereof.

* * * * *